United States Patent [19]

Basol et al.

[11] 4,388,483
[45] Jun. 14, 1983

[54] THIN FILM HETEROJUNCTION PHOTOVOLTAIC CELLS AND METHODS OF MAKING THE SAME

[75] Inventors: Bulent M. Basol; Eric S. Tseng; Robert L. Rod, all of Los Angeles, Calif.

[73] Assignee: Monosolar, Inc., Santa Monica, Calif.

[21] Appl. No.: 300,116

[22] Filed: Sep. 8, 1981

[51] Int. Cl.³ .................. H01L 31/06; H01L 31/18; C25D 5/50; C25D 9/04
[52] U.S. Cl. ........................ 136/260; 136/264; 204/37 R; 204/40; 148/1.5; 357/16; 357/30
[58] Field of Search ............ 148/1.5; 204/37 R, 38 S, 204/40; 29/572; 427/74, 76, 86, 87; 136/260, 264; 357/16, 30

[56] References Cited

U.S. PATENT DOCUMENTS

| | | | |
|---|---|---|---|
| 4,207,119 | 6/1980 | Tyan | 136/258 PC |
| 4,231,808 | 11/1980 | Tabei et al. | 136/260 |
| 4,260,427 | 4/1981 | Fulop et al. | 136/255 |

FOREIGN PATENT DOCUMENTS 5313382  2/1976  Japan ................................ 136/260

OTHER PUBLICATIONS

H. Serreze et al., "Spray Pyrolysis Prepared CdTe Solar Cells", *Conf. Record, 15th IEEE Photovoltaic Specialists Conf.*, (1981), pp. 1068–1072.
Y. Y. Ma et al., "Photovoltaic Properties of n-CdS/-p-CdTe Heterojunctions Prepared by Spray Pyrolysis", *Appl. Phys. Lett.*, vol. 30, pp. 423–424, (1977).
K. Yamaguchi et al., "Photovoltaic Effect in CdTe-CdS Junctions Prepared by Vapour Phase Epitaxy", *Japan. J. Appl. Phys.*, vol. 15, pp. 1575–1576, (1976).
E. I. Adirovich et al., "Photoelectric Effects in Film Diodes With CdS-CdTe Heterojunctions", *Soviet Physics-Semiconductors*, vol. 3, Jul. 1969, pp. 61–64.
N. Nakayama et al., "Screen Printed Thin Film CdS/CdTe Solar Cell", *Japan. J. Appl. Phys.*, vol. 19, pp. 703–712, (1980).

*Primary Examiner*—Aaron Weisstuch
*Attorney, Agent, or Firm*—William A. Kemmel, Jr.

[57] ABSTRACT

A method of fabricating a thin film heterojunction photovoltaic cell which comprises depositing a film of a near intrinsic or n-type semiconductor compound formed of at least one of the metal elements of Class II B of the Periodic Table of Elements and at least tellurium and then heating said film at a temperature between about 250° C. and 500° C. for a time sufficient to convert said film to a suitably low resistivity p-type semiconductor compound. Such film may be deposited initially on the surface of an n-type semiconductor substrate. Alternatively, there may be deposited on the converted film a layer of n-type semiconductor compound different from the film semiconductor compound. The resulting photovoltaic cell exhibits a substantially increased power output over similar cells not subjected to the method of the present invention.

7 Claims, 6 Drawing Figures

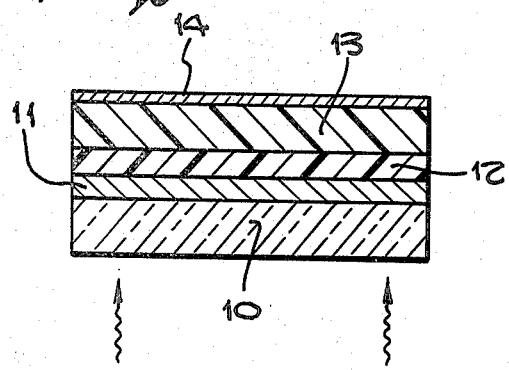
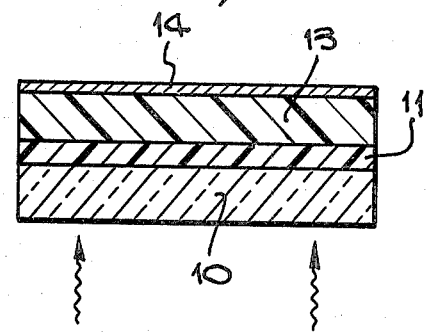
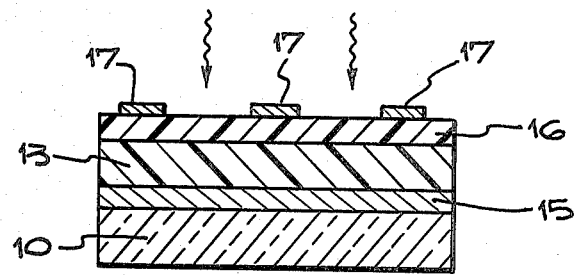
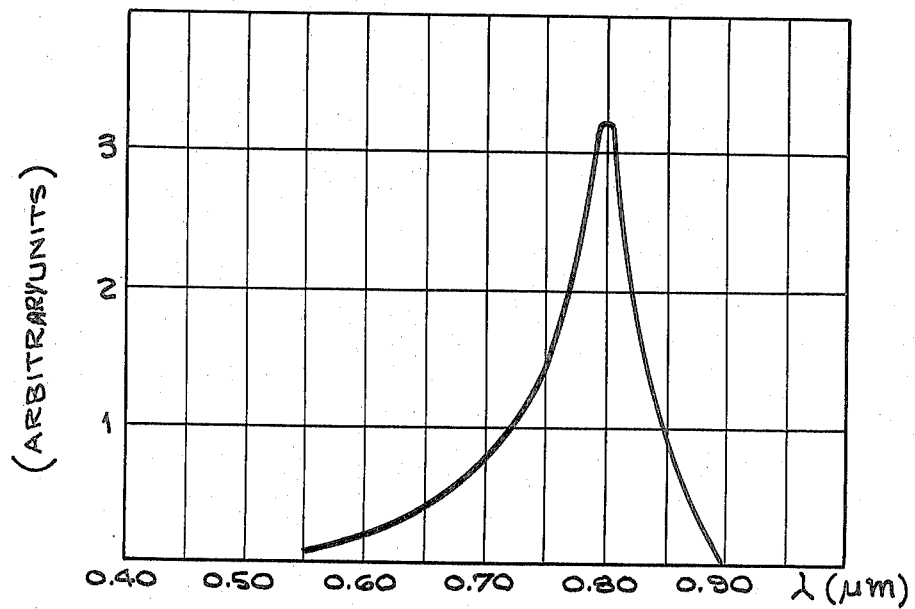
Fig. 4. SPECTRAL RESPONSE BEFORE HEAT TREATMENT

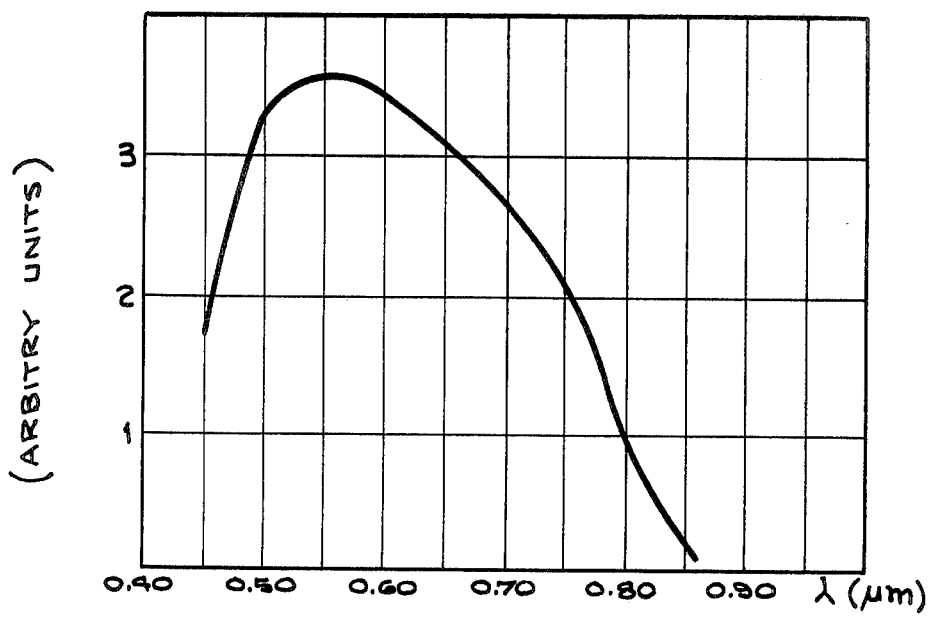
Fig. 5. SPECTRAL RESPONSE AFTER HEAT TREATMENT
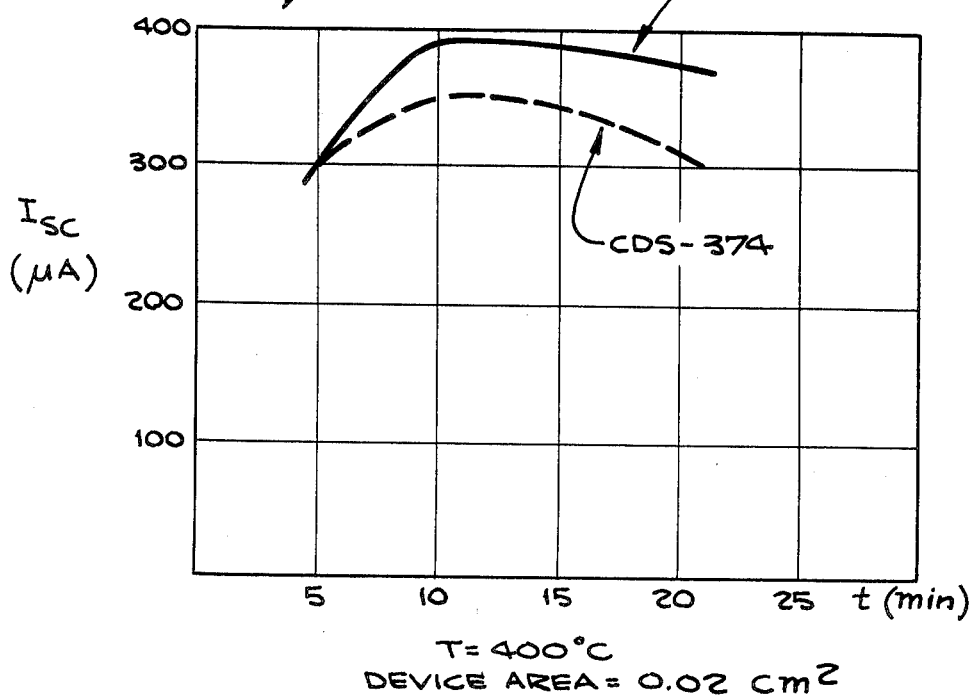
Fig. 6.

THIN FILM HETEROJUNCTION PHOTOVOLTAIC CELLS AND METHODS OF MAKING THE SAME

BACKGROUND OF THE INVENTION

This invention relates to thin film heterojunction photovoltaic cells and methods of making them, and more particularly to the deposition of a film of a near intrinsic or n-type Class II B and tellurium containing semiconductor compound such as cadmium telluride and then heat treating said film to convert it to a suitably low resistivity p-type semiconductor compound with such film either being initially in contact with an n-type semiconductor substrate different from the film semiconductor compound or later having deposited thereon a layer of an n-type semiconductor compound different from the film semiconductor compound.

In general, the heat treating of thin film semiconductors is well known and practiced for a variety of reasons. For example, in the UK patent application No. GB2,006,268A, filed Oct. 11, 1978 by the University of Queensland, heat treatment of an electrodeposited film for one and a half hours in an atmosphere of argon at 350° C. may be used to improve the crystallinity of the film. Similarily, in the U.S. Pat. No. 4,260,427, issued Apr. 7, 1981 to Ametek, Inc., heat treating in a nitrogen atmosphere at an elevated temperature on the order of 250° C. for 60 minutes increases significantly the effficiency of a Schottky barrier solar cell, presumably by increasing the small crystal grain size. Alternatively, the Ametek patent teaches that such annealing treatment can be done in an oxidizing atmosphere to grow an oxide layer at 300° C. and 60 minutes. Such latter approach was suggested in U.S. Pat. No. 4,035,197, issued July 12, 1977 to Eastman Kodak. In the Eastman Kodak patent, the surface of a layer of cadmium telluride is heated in an oxygen containing atmosphere for between about one minute and about twenty minutes at a temperature between about 250° C. and about 500° C. to alter the surface. A Schottky barrier solar cell was then formed by applying a metal electrode to such altered surface. Still another heat treating step is taught by U.S. Pat. No. 4,231,808, issued Nov. 4, 1980 to Fuji Photofilm, wherein an n-type cadmium telluride film is heated at a temperature between about 80° C. and 200° C. for about twenty to one hundred eighty minutes, i.e., rather gentle heating conditions, to form p-type cadmium telluride at the surface and thereby form a shallow p-n homojunction. Such conversion of the surface of n-type CdTe to p-type using low temperature heat treatment was earlier described by Yu A. Bodakov, et. al., in *Fizika Tuerdogo Tela*, Vol. 2, No. 1, pp-55-61, January, 1960. The Fuji patent expressly teaches that heat treatment under more severe conditions deteriorates the performance of the photovoltaic cell, probably by converting the entire thickness of the originally n-type cadmium telluride thin film to p-type.

From this review of the prior art, it is apparent that there has been a failure to appreciate the full potential use of heat treatment in the preparation of higher efficiency thin film photovoltaic cells. Consequently, an object of the present invention is an improved method of fabricating a heterojunction thin film photovoltaic cell utilizing a heat treatment.

Still another object of the present invention is a method of fabricating a thin film heterojunction photovoltaic cell which involves the conversion of a near intrinsic or n-type semiconductor film to p-type to form a p-n junction with a different n-type semiconductor layer.

SUMMARY OF THE INVENTION

In general, the present invention involves depositing a film of near intrinsic or n-type semiconductor compound formed of at least one of the metal elements of Class II B of the Periodic Table of Elements and at least tellurium and heating said film at a temperature between about 250° C. and 500° C. for time sufficient to convert said film to a suitably low resistivity p-type compound. Said film may be deposited on an n-type semiconductor substrate different from the film semiconductor compound, which substrate is preferably composed of an n-type semiconductor compound layer deposited on a metal oxide coated glass. Alternatively, the n-type semiconductor layer may be deposited on the semiconductor compound film after it has been thermally converted to p-type.

In order to facilitate understanding of the present invention, reference will now be made to the drawings and to a preferred specific embodiment of the present invention and specific examples thereof. Such examples, like the preceding summary, should not be construed as limiting the present invention which is properly set forth in the appended claims.

DESCRIPTION OF THE DRAWINGS

FIG. 1 is a cross sectional view of a schematic drawing of the preferred embodiment of the photovoltaic cell constructed in accordance with the present invention.

FIG. 2 is a cross sectional view of another schematic embodiment of a photovoltaic cell constructed in accordance with the present invention.

FIG. 3 is a cross sectional view of still another schematic embodiment of a photovoltaic cell constructed in accordance with the present invention.

FIG. 4 is a graph showing the relative spectral response as a function of the wavelength of incident light on the photovoltaic cell constructed partially in accordance with the present invention by eliminating the heat treating step.

FIG. 5 is a graph similar to that of FIG. 4 using a photovoltaic cell constructed in accordance with the present invention including the heat treating step.

FIG. 6 is a graph showing the short circuit current of solar cells made in accordance with the present invention as a function of heating time at the specified temperature.

DESCRIPTION OF THE PREFERRED EMBODIMENT OF THE INVENTION

As shown in FIG. 1, the preferred embodiment of the present invention includes a first sheet 10 of insulating transparent material such as glass. On sheet 10 is a layer 11 of a conductive transparent material such as indium tin oxide. On layer 11 is deposited a layer 12 of a semiconductor layer such as cadmium sulfide different from the film semiconductor compound described below. The combination of layers 11 and 12 comprise an n-type wide band window semiconductor substrate different from the film 13 semiconductor compound described below. On layer 12 is deposited a film 13 of a semiconductor compound formed of at least one of the metal elements of Class II B of the Periodic Table of Elements and at least tellurium. Film 13 is a near intrinsic or n-type semiconductor compound. On the surface of the film 13 is deposited a layer 14 of a conductive material such as the metal gold which forms a good ohmic contact with the film 13 material. On the surface of layer 14, a suitable grid pattern may be deposited, if necessary.

The embodiment of the present invention shown in FIG. 2 is identical to the embodiment shown in FIG. 1 except the layer 12 has been eliminated so that the layer 11 forms the n-type conductive transparent material.

The embodiment of the present invention shown in FIG. 3, unlike the back wall photovoltaic cells shown in FIGS. 1 and 2 where the light enters from the sheet 10 side, is a front wall cell where the light enters from the layer 16 side. In FIG. 3, on sheet 10 of an insulating transparent material such as glass is deposited a conductive layer 15 of a metal such as molybdenum. On layer 15 is deposited a film 13 of a near intrinsic or n-type semiconductor compound formed of at least one of the metal elements in Class II B of the Periodic Table of Elements and at least tellurium. Deposited on the film 13 is a layer 16 of transparent n-type semiconductor compound material. Such layer 16 may be the same as layer 11 or layer 12 or a combination of layers 11 and 12 discussed above. Finally, a grid 17 that makes good ohmic contact with layer 16 is deposited on layer 16.

The preferred embodiment of the present invention and the method of making the same can best be described by reference to a specific semiconductor device whose method of construction shall now be described. Except for the step of the electrodeposition of cadmium sulfide (described below) and the step of the heat treating (described below) the method of making the photovoltaic device illustrated in FIG. 1 has been described in detail in the commonly assigned patent application of Ferdinand A. Kroger, Robert L. Rod and Ramachandra Panicker entitled, "Photovoltaic Power Generating Means and Methods" Ser. No. 883,150, filed Mar. 3, 1978 now abandoned in favor of continuation application Ser. No. 212,106, filed Dec. 2, 1980, which description is hereby incorporated by reference. However, certain modifications of such method will be noted below. On the sheet of glass 10 is initially deposited by conventional techniques a relatively thick layer 11 of approximately 5000 Angstroms of indium tin oxide having a sheet resistance of approximately 10 ohms per square. On such layer 11 is deposited a layer 12 of a thickness of about 200 to 500 Angstroms of cadmium sulfide which is electrodeposited using the same equipment and generally the same process as described in the aforementioned patent application except a single inert anode is used. The cadmium sulfide deposition electrolyte consists of a solution of about 0.1 M to 0.5 M of cadmium sulfate or cadmium chloride and about 0.01 M to 0.05 M of sodium thiosulfate with a pH of about 1.5 to 4.0. The deposition voltage for the cadmium sulfide is between about $-0.6$ V to about a $-0.7$ V with reference to the standard saturated calomel electrode and the electrolyte is stirred and heated to a temperature of about 90° C. The current density is dependent upon the pH, stirring rate and the substrate but customarily the current density is about 0.2 mA/cm$^2$ at a pH of about 4.

Deposited on the cadmium sulfide layer 12 is a cadmium telluride film 13 having a thickness of about 1.3 microns made by using an aqueous cadmium sulfate electrolyte with tellurium and graphite anodes. The pH of the solution is about 1.7 and the tellurium concentration is adjusted to about 18 parts per million. The quasi-rest potential is kept between about $-0.51$ V to $-0.61$ V relative to a standard saturated calomel electrode during electrodeposition.

After the electrodeposition of the cadmium telluride film 13 the sample produced was divided into two pieces. One piece was etched in hot (80° C.) aqueous KOH solution (30% by weight) for 20 seconds. Then a pattern of gold back electrode dots having an area of approximately 2 mm$^2$ each was evaporated and the photovoltaic cell parameters of short circuit current ($I_{sc}$) and open circuit voltage ($V_{oc}$) were measured by shining simulated AM1 solar radiation through the glass sheet 10 using a General Electric EFR, 115 W, 15 V quartz halogen lamp. The spectral response is also measured using narrow band filters and the resulting curve given in FIG. 4. FIG. 4 shows the spectral response of the resulting solar cell under such illumination.

The other piece of the sample was put into an open glass tube and then a furnace that is preheated to about 400° C. The temperature near such sample rises to about 350° C. in about 10 minutes. After keeping the sample at such temperature for about 10 more minutes, the sample is taken out of the hot zone of the furnace and is allowed to cool to room temperature by itself. Next the sample is sequentially etched in a 30% KOH solution for about 20 seconds at about 80° C. and then in mild bromine methanol (bromine concentration about 0.1%) for about 5 seconds, rinsed in methanol, blow dried with nitrogen, and placed in the vacuum chamber. Next the gold dots were evaporated on the sample as set forth above and the sample was again measured by shining light thereon as set forth above. FIG. 5 shows the spectral response of the sample.

The results of measurements on the samples illustrated in FIGS. 4 and 5 are tabulated in Table 1 and such measurements determined that the fill factors for both samples were relatively similar. As shown in Table 1, the improvement obtained by the heat treating step is approximately a factor of 60 times increase in the power output of the solar cell. The voltage approximately doubles while the current increases approximately 30 times.

TABLE 1

| | ($P_{in}$ = 100 mw/cm$^2$) | | |
|---|---|---|---|
| | $V_{oc}$ | $I_{sc}$ | $J_{sc}$ |
| Not Heat treated film | 350 mV | 6μa | 1.3 mA/cm$^2$ |
| Heat treated film | 630 mV | 215μa | 10.7 mA/cm$^2$ |

The mechanism responsible for producing low resistivity p-type material giving the unexpected, very marked improvement in the performance of a solar cell as a result of the heating is not precisely understood, but it may be postulated to be as follows. In the absence of heat treatment, the CdTe film as deposited is a high-resistivity n-type material and the CdS (i.e., the n-type film on the n-type metal oxide layer) serves as an electron injecting contact to one surface of the CdTe. When a conductor, e.g., a gold electrode, is evaporated onto the surface of the CdTe, there results an n-CdTe/Au Schottky barrier cell. The efficiency of this structure is limited, for if the radiant energy is incident on the glass substrate surface, most of the charge carriers are generated near the injecting contact rather than in the depletion region. This gives rise to low $J_{sc}$ values. If, on the other hand, radiation enters the device through the gold contact, a large percentage of it is reflected from or absorbed in the gold, again giving rise to low values of photogenerated current. FIG. 4 clearly shows that the photoactive junction in the cell without heat treatment is at the Au/CdTe interface.

When, however, the assembly is heat treated in accordance with the present invention (before deposition of the gold film), substantially all of the CdTe is converted to p-type, due apparently to the loss of cadmium through vaporization and to the activation of the resulting excess tellurium in the film. This is shown by the spectral response plot of FIG. 5 obtained under the same conditions as in FIG. 4 except that the n-type CdTe film in the cell had been thermally converted to p-type. FIG. 5 clearly shows that the spectral response peak has moved from the Au/CdTe interface to the CdS/CdTe interface, giving rise to a highly efficient heterojunction photovoltaic cell with the gold layer acting just as an ohmic contact to the CdTe layer.

A large number of heterojunction solar cells have been manufactured using the above described invention. The heat treatment temperature and heat treatment time are found to be important factors in the resulting efficiency of the cells. Although the formation of a heterojunction as described in our invention takes place at temperatures above about 250° C., we have found that as far as the heat treatment time is concerned temperatures between about 350° C. and 450° C. are preferred. FIG. 6 shows the short circuit current under 100 mW/cm² illumination of two heterojunction solar cells produced using the present invention, as a function of the heat treatment time. The temperature chosen was 400° C. and the heat treatment was carried out in air. As shown in FIG. 6, under the given conditions the best heat treatment time is around 10 minutes. Using 10 minute treatment at 400° C. we produced other CdS/CdTe heterojunctions. Their characteristics are given in Table 2.

TABLE 2

| DEVICE | $V_{oc}$ (V) | $I_{sc}$ (μA) | $J_{sc}$ (mA/cm²) | % Efficiency |
|---|---|---|---|---|
| CDS-36 | .625 | 370 | 18.5 | 6.13 |
| S-1 | .695 | 336 | 16.8 | 6.45 |
| P-9-9 | .67 | 400 | 20 | 6.67 |
| P-9-38 | .68 | 400 | 20 | 7 |
| P-9 | .69 | 400 | 20 | 7.18 |

An example of a method of making the cell illustrated in FIG. 3 involves vacuum coating the surface of a sheet of glass 10 with a layer of chromium approximately 50 Angstroms thick and then with a layer of molybdenum approximately 1 micron thick, thereby forming the layer 15. On such molybdenum layer a cadmium telluride layer 13 of approximately 0.6 microns thickness is then deposited and heat treated as described in the foregoing example. Next a cadmium sulfide layer 16 of approximately 4 microns thickness is vacuum deposited on the cadmium telluride surface in the form of dots having an area of approximately 2 mm². Silver paint is then put on such dots to make electrical contact. Measurements made by shining light on such devices indicated that a CdS/CdTe junction was obtained.

A variety of materials may be used in each of the elements of the photovoltaic cell of the present invention. With respect to the sheet 10 of FIGS. 1 and 2, the basic requirements for the materials are that it be transparent, insulating and have sufficient structural strength to provide the necessary support for the remaining portions of the device. Thus, suitable materials are glass and plastic. In FIG. 3, the sheet 10 can be replaced by any kind of suitably strong structural material (insulating or conductive) without affecting the operation of the solar cell.

Next, with respect to the n-type wide band window semiconductor substrate different from the film semiconductor compound, it may consist of one or more layers of transparent material, provided that it contains an appropriate n-type material at a surface where it makes contact with the semiconductor compound film. As shown in FIGS. 1 and 2, one of such layers may be an n-type metal oxide layer made of materials such as indium tin oxide, tin oxide, indium oxide and cadmium stannate. The transparent n-type semiconductor material layer 11 must be capable of forming an n-p heterojunction with p-type semiconductor film 13. It must also be capable, without undergoing any essential change or degradation in its electrical characteristics, of withstanding the heat treatment required to produce the p-type semiconductor compound film from the semiconductor compound film 13. When a second layer 12 of n-type semiconductor material is used as shown in FIG. 1, it must meet essentially the same requirements and may be formed out of materials such as cadmium sulfide, cadmium selenide, zinc oxide, zinc selenide, or cadmium zinc sulfide.

As noted above, in the preferred embodiment of the present invention, a two layer structure of a IIB-VIA semiconductor compound layer on a metal oxide layer is preferred over a single layer of either a IIB-VIA semiconductor compound or a metal oxide although each of the latter may be used alone.

If the semiconductor compound film such as cadmium telluride is deposited directly upon the metal oxide layer, one may encounter problems in the subsequent heat treating step which cause cracks or pin holes being developed in the thin semiconductor film due to the large differences between the thermal expansion coefficients of such layers. Thus by utilizing a IIB-VIA semiconductor compound layer different from the film semiconductor compound a better thermal expansion coefficient match can be achieved. In addition to the two layers of n-type semiconductor material described above, their surface adjoining the semiconductor compound film may have a very thin (10–30 Angstroms) insulating layer such that the charge carriers can tunnel through such insulating layer. In such situation, a semiconductor/insulator/semiconductor heterojunction can be obtained instead of a semiconductor/semiconductor heterojunction. Examples of such insulating layer are silicon dioxide, silicon monoxide, insulating zinc sulfide or zinc selenide.

In addition, an appropriate grid may be formed between the substrate 10 and film 11 or between the films 11 and 12 in FIG. 1. Similarly, a grid may be formed between the substrate 10 and film 11 of FIG. 2. This reduces the series resistance introduced in large area devices by the conductive layers 11 and/or 12.

With respect to the semiconductor compound film 13, the compound which is preferred is cadmium telluride; however, other compounds formed of at least one of the metal elements of Class II B of the Periodic Table of Elements and at least tellurium either by itself or with another non-metal of Class VI A of the Periodic Table of Elements. Specific examples of such compounds are cadmium tellurium selenide, cadmium tellurium sulfide, zinc telluride, and mercury cadmium telluride. Such semiconductor compound may be initially an n-type semiconductor compound or a near intrinsic semiconductor compound such as high resistivity (about $10^5$ ohm-cm) p-type semiconductor compound or an intrinsic semiconductor compound. In any event, after heat treatment such semiconductor compound becomes a suitably low resistivity (below about $10^5$ ohm-cm) p-type semiconductor compound. Preferably such resistivity is below about $10^4$ ohm-cm. Further, such semiconductor compound film in the case of cadmium telluride should have a thickness less than about 3 microns because the absorption of the light is almost complete with such thickness. The preferred thickness of the cadmium telluride semiconductor film 13 is about 0.5 micron to about 1.5 microns.

With respect to the conductive layer 14 in FIGS. 1 and 2 or the conductive layer 15 in FIG. 3, it can be made of any conductive material or combination of layers of such materials provided the surface of such conductive layer or layers facing the semiconductor films make a good ohmic contact with such films. Such conductive materials include gold, nickel, silver, copper, tellurium, antimony, molybdenum, and the metal tellurides. Any grid such as the grid 17 in FIG. 3, or a grid on the conductive layers 14 or 15 may be made of low resistivity metals such as copper, silver and gold.

Any one of a number of known techniques may be used to deposit the semiconductor layer and the metal films such as direct vacuum evaporation or sputtering, reactive sputtering, or electrodeposition. However, the preferred technique for the semiconductor films that are active in the solar cell is electrodeposition because of the close control which said process permits with respect to the operating variables and because such technique permits the deposition of films of closely controlled thickness as well as composition.

With respect to the heat treating step, it may be carried out at a temperature between about 250° C. to 500° C.; however, the preferred temperature range is between about 350° C. and 450° C. With respect to the time of the heat treating step, it should be sufficient to convert the semiconductor compound film to the suitably low resistivity p-type material to form the heterojunction between said film and the n-type semiconductor substrate. The time period for such heat treating is dependent upon not only the thickness of the semiconductor compound film but also the temperature utilized in the heat treating process, so that it can range from as short as about 5 to 10 minutes to as long as about 24 hours. However, when the thickness of the cadmium telluride semiconductor film is in the range of 0.5 microns to 1.5 microns and the temperature of the heat treating is in the range from 350° C. to 450° C., such time period will normally range from about 5 minutes to 20 minutes.

There are many features in the present invention which clearly show the significant advantage which the present invention achieves over the prior art. Consequently only a few of the more outstanding features will be pointed out to illustrate the unexpected and unusual results obtained by the present invention. One feature is that as illustrated by the references discussed initially, the customary purpose of heat treating solar cell devices is to improve some presently existing physical characteristics such as increasing the grain size. Contrary to such purpose, in the present invention the purpose of the heat treating is to convert one physical characteristic into an entirely different physical characteristic, I.e., to change the semiconductor compound film generally from n-type (or possibly near intrinsic) material to p-type material. In the rare situation where such effect of heat treating was tentatively recognized such as in the above described Fuji patent, the inventors at most recognized only the formation of a shallow homojunction in the semiconductor compound film and expressly teach that the more severe heating treatment which might cause complete conversion must be avoided because it degraded the performance of the cell. Such partial conversion of CdTe from n-type to p-type only at surface by heat treatment has been known and considered a surface phenomenon for many years, as noted above. However, only the present invention recognized that by conversion of the bulk of the film, more efficient solar cells could be produced. Another feature of the present invention is the utilization of a double layer n-type wide band window semiconductor substrate to facilitate production of the photovoltaic cell. Still another feature of the present invention is that it may be utilized either in connection with a front wall or a back wall photovoltaic cell.

It will be understood that the foregoing description is only illustrative of the present invention and it is not intended that the invention be limited thereto. Also substitutions, alterations and modifications of the present invention which come within the scope of the following claims or to which the present invention is readily susceptible without departing from the spirit and scope of this disclosure are considered part of the present invention.

What is claimed is:

1. A method of fabricating a thin film heterojunction photovoltaic cell comprising:
    (a) electrodepositing a film of a near intrinsic or n-type semiconductor compound formed of at least one of the metal elements of Class II B of the Periodic Table of Elements and at least tellurium on the surface of an n-type wide band window semiconductor substrate different from the film semiconductor compound; and (b) heating said film at a temperature between about 250° and 500° C. for a time sufficient to convert said film to a suitably low resistivity p-type compound, thereby forming a heterojunction between said film and said n-type semiconductor substrate.

2. A method as stated in claim 1 wherein the surface of said semiconductor substrate is formed by electrodepositing a layer of semiconductor compound different from the tellurium containing film semiconductor compound and is formed of at least one of the metal elements of Class II B and one of the non-metal elements of Class VI A of the Periodic Table of Elements.

3. A method as stated in claim 1 wherein said temperature is between about 350° C. and 450° C.

4. A method as stated in claim 3 wherein said time is between about 5 minutes and 20 minutes.

5. A method of fabricating a thin film heterojunction photovoltaic cell comprising:
    (a) electrodepositing a film of a near intrinsic or n-type semiconductor compound formed of at least one of the metal elements of Class II B of the Periodic Table of Elements and at least tellurium;
    (b) heating said film at a temperature between about 250° C. and 500° C. for a time sufficient to convert said film to a suitably low resistivity p-type compound; and (c) electrodepositing on said film a layer of n-type semiconductor material different from the film semiconductor compound.

6. A thin film heterojunction photovoltaic cell formed by (a) electrodepositing a layer of a thickness of about 0.02 to 0.05 microns of a semiconductor compound formed of at least one of the metal elements of Class II B and one of the non-metal elements of Class VI A of the Periodic Table of Elements, (b) electrodepositing on said layer a film of a near intrinsic or n-type semiconductor compound different from the layer semiconductor compound and formed of at least one of the metal elements of Class II B of the Periodic Table of Elements and at least tellurium and (c) heating said film at a temperature between about 250° and 500° C. for a time sufficient to convert said film to a suitably low-resistivity p-type semiconductor compound.

7. A thin film heterojunction photovoltaic cell formed by (a) electrodepositing a film of a near intrinsic or n-type semiconductor compound formed of at least one of the metal elements of Class II B of the Periodic Table of Elements and at least tellurium, (b) heating said film at a temperature between about 250° and 500° C. for a time sufficient to convert said film to a suitably low resistivity p-type semiconductor compound, and (c) electrodepositing on said film a layer of a thickness of about 0.02 to 0.05 microns of a semiconductor compound formed of at least one of the metal elements of Class II B and one of the non-metal elements of Class VI A of the Periodic Table of Elements.

* * * * *